United States Patent [19]

Koike et al.

[11] Patent Number: 4,908,684
[45] Date of Patent: Mar. 13, 1990

[54] SOLID-STATE IMAGING DEVICE

[75] Inventors: Norio Koike, Tokyo; Toshifumi Ozaki, Koganei; Masaaki Nakai, Tokorozawa; Haruhisa Ando, Tokyo; Shinya Ohba, Kanagawa; Hideyuki Ono, Kokubunji; Hajime Akimoto, Hachioji; Hajime Kinugasa, Mobara, all of Japan

[73] Assignees: Hitachi, Ltd., Tokyo; Hitachi Device Engineering Co., Ltd., Mobara, both of Japan

[21] Appl. No.: 70,552

[22] Filed: Jul. 7, 1987

[30] Foreign Application Priority Data

Jul. 7, 1986 [JP] Japan ................. 61-157820
Jul. 11, 1986 [JP] Japan ................. 61-161832
Nov. 12, 1986 [JP] Japan ................. 61-267653

[51] Int. Cl.⁴ .................. H01L 29/78; H01L 27/14; H01L 31/00; G11C 19/28
[52] U.S. Cl. ............................ 357/24; 357/30; 377/58; 358/213.19
[58] Field of Search .............. 357/24, 30; 377/57–63; 358/213.19

[56] References Cited

U.S. PATENT DOCUMENTS

| 4,518,978 | 5/1985 | Takesita | 357/24 LR |
| 4,697,200 | 9/1987 | Miyatake | 357/24 LR |
| 4,774,586 | 9/1988 | Koike et al. | 357/24 LR |

Primary Examiner—Gene M. Munson
Attorney, Agent, or Firm—Antonelli, Terry & Wands

[57] ABSTRACT

A solid-state imaging device includes a vertical CCD shift register for transferring electric charge. The electrode of the vertical CCD located nearest to the substrate is extended outside of the region of the vertical CCD to a region of a layer where isolation is required. The layer is thus imparted with two functions, that is, the function of the CCD electrode and that of the iolation electrode. An overflow transistor is also provided to discharge excess charge produced by high intensity light.

9 Claims, 13 Drawing Sheets

FIG. 1 PRIOR ART
FIG. 2 PRIOR ART
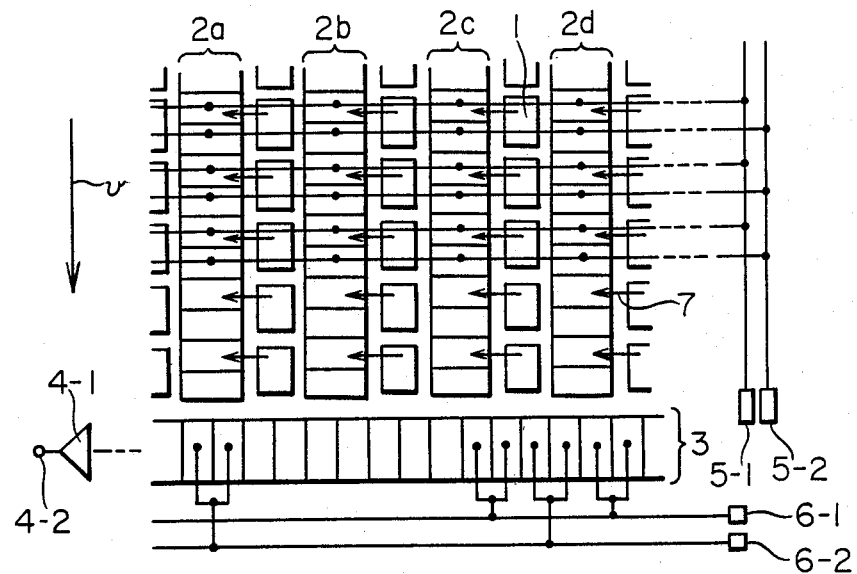
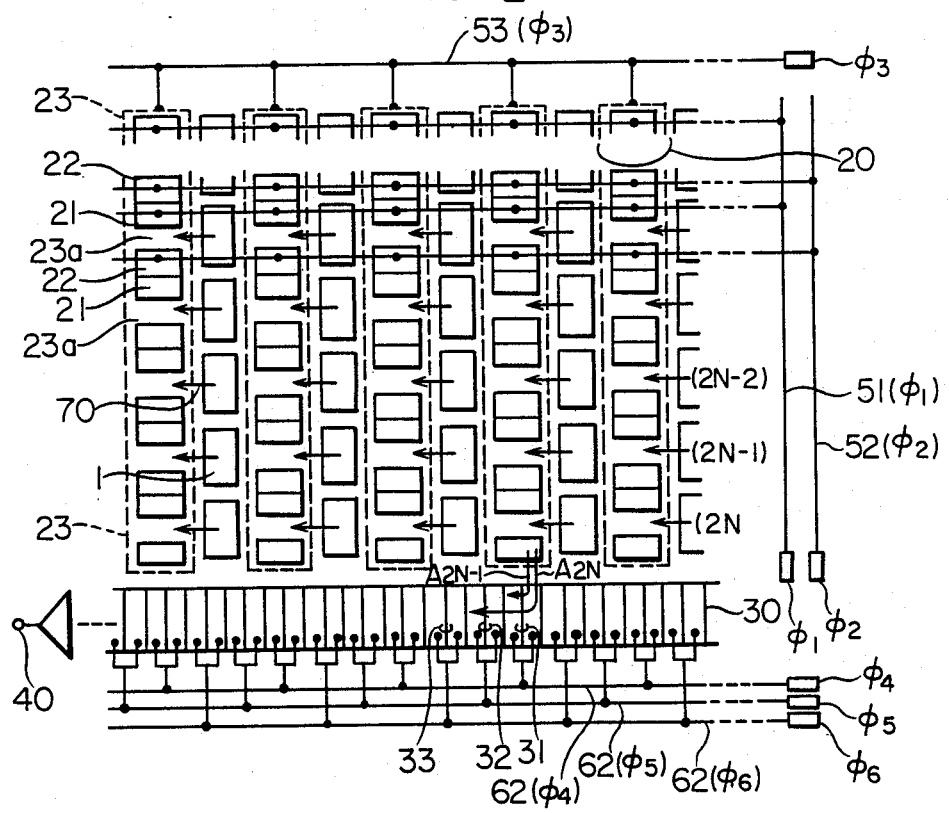

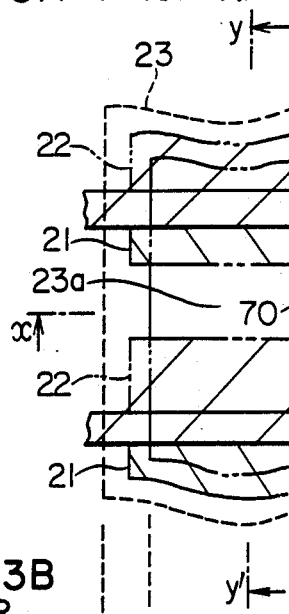
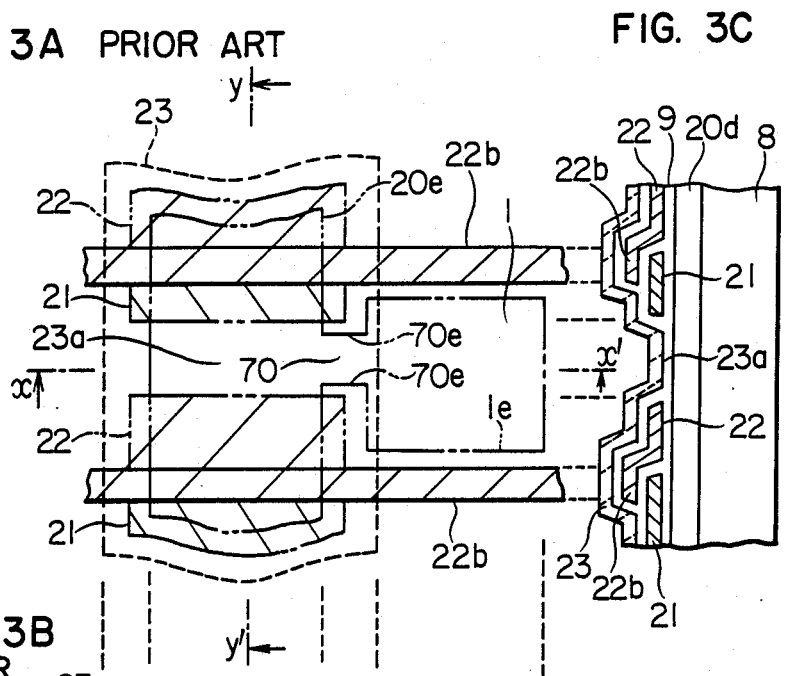
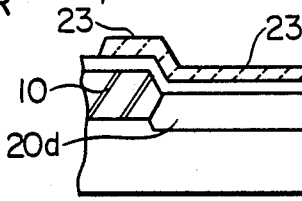
FIG. 3A PRIOR ART
FIG. 3B PRIOR ART
FIG. 3C

SOLID-STATE IMAGING DEVICE

BACKGROUND OF THE INVENTION

The present invention relates to a solid-state imaging device in which photoelectric conversion elements and charge-coupled devices (hereinafter referred to as CCDs) for extracting optical information from the photoelectric conversion elements are realized on a semiconductor substrate in an integrated structure.

In the solid-state imaging device, an imaging plate imparted with as high a resolution power as that of the imaging tube used commonly in existing television broadcasting system is required. To accomplish such high resolution power, there is required a matrix composed of 500 photoelectric conversion elements (pixels) arrayed in the vertical direction and 800 to 1000 photoelectric conversion elements arrayed horizontally as well as a corresponding number of scanning elements. Under the circumstances, the solid-state imaging device is manufactured by resorting to MOS LSI technique which can assure a high integration density, wherein CCDs, MOS transistors or the like are used as the structural elements.

FIG. 1 of the accompanying drawings shows a basic arrangement of a CCD-type solid-state imaging device known heretofore which is characterized by low noise. By way of example, reference may be made to Oda et al's article entitled "A Study of Vertical Over-Flow Structure CCD Imager" in National Convention Record of the Institute of Television Engineers of Japan in 1981, pp 57–58. Referring to FIG. 1, reference symbol 1 denotes photoelectric conversion elements each constituted, for example, by a photodiode, reference numerals 2a, 2b, 2c and 2d denote vertical CCD registers for transferring signals stored in photoelectric elements 1 in the vertical direction v, and 3 denotes a horizontal shift register for extracting the signals from the individual CCD shift registers 2a, 2b, 2c and 2d through output terminal 4-2 of a signal detection circuit 4-1. Clock pulse generators 5-1, 5-2, 6-1 and 6-2 serve to generate clock pulses for driving the vertical shift registers 2a, 2b, 2c and 2d and the horizontal shift register 3. Further, reference numeral 7 denotes transfer gates for transferring electric charges stored in the photodiodes 1 to the vertical shift registers 2a, 2b, 2c and 2d. The solid-state imaging device of the arrangement shown in FIG. 1 can operate solely as a black-and-white imaging device and laminated superposition of color filters on the photoelectric conversion elements is necessary in order that the individual photodiodes serve for storing color information so that the imaging device can function as a color imaging device.

As is well known in the art, the solid-state imaging device has numerous advantages such as small size, light weight, maintenance-freedom, low power consumption and others, when compared with electronic tubes, promising thus high performance as the imaging apparatus. It is however noted that the CCD imaging devices known heretofore suffer problems mentioned below:

(1) The interlaced scanning is performed in the vertical direction in such a manner in which signals are read out from the picture elements or pixels on the odd-numbered rows such as 1st, 3rd, fifth, . . . , (2N−1)-th rows during a first field, while in the second field, signals are read out from the even-numbered rows such as 2nd, fourth, sixth, . . . , 2N-th rows. As the consequence, in the first field of the succeeding frame, signals which were not read out in the just preceding field (i.e. signals on the odd-numbered rows) can be read out in addition to the new signals. This phenomenon is generally referred to as the image lag.

(2) As will be appreciated from the foregoing, signals of the pixels (i.e. picture elements) are read out only on the every-other-row basis in each field. Consequently, the color imaging device is imposed with restriction in respect to the arrangement of color filters as well as the signal processing procedure, resulting in that the resolution power in the vertical direction corresponds only to that equivalent to a half of the pixels arrayed in the vertical direction.

With a view to solving the problems mentioned above, the inventors of the present application has previously proposed a CCD imaging device of a structure illustrated in FIG. 2. Reference also may be made to U.S. Patent Serial No. 768,113 filed Aug. 21, 1985 now U.S. Pat. No. 4,774,586, issued Sept. 27, 1988.

The arrangement of the device shown in FIG. 2 differs from the hitherto known one shown in FIG. 1 in respect to the vertical CCD shift register 20 and the horizontal CCD shift register 30. In the case of the arrangement shown in FIG. 2, the vertical CCD shift register 20 includes gate electrodes 21 and 22 wired horizontally and a gate electrode 23 extending vertically so as to cover the shift register 20. In this shift register 20, one bit thereof is constituted by three electrodes 21, 23a and 22 rather than the standard two electrodes found in conventional devices. Consequently, signal charges stored in the photodiodes of each row can be transferred independently on a one-bit basis corresponding to the vertical pitch of the photodiode array. Because of this three-electrode structure information can be read out from the photoelectric conversion elements of all the rows in each field. Thus, difficulty of the every-other-row skipping read-out in the hitherto known imaging device using only two electrodes can be overcome. However, the horizontal CCD shift register has to be so implemented as to be capable of transferring twice as much as information as that required with the hitherto known CCD device.

FIG. 3A shows in a fragmental enlarged plan view of the vertical CCD shift register 20 shown in FIG. 2. In FIG. 3A, reference numerals 21 and 22 denote electrodes serving simultaneously as wiring conductors 21b (not shown) and 22b, where the electrode 21 may be formed of a first layer of polycrystal silicon with the electrode 22 being realized in the form of a second layer of polycrystal silicon. Reference symbol 23a denotes an electrode for a third layer, which electrode is laid in the longitudinal direction so as not to traverse the photodiode region. FIG. 3B is a sectional view taken along the line X–X' in FIG. 3A. In FIG. 3B, reference numeral 10 denotes a thick oxide film for realizing electrical isolation between the photodiode 1d and the vertical CCD and among the photodiodes, reference numeral 9 denotes a thin oxide film for forming an active region (i.e. the CCD region or transfer gate region 70), and 23 denotes a third electrode layer extending vertically. Referring to FIG. 3C which is a sectional view taken along the line y–y' in FIG. 3A, reference numerals 21, 22 and 23 denote first, second and third electrode layers, respectively. Further, reference symbol 20d denotes a buried channel layer (of a second conductivity type same as that of the photodiode, for example). This layer 20d can be omitted, when the CCD shift register is realized in a surface channel type structure. Although a three-phase driving system for the vertical CCD 20 is illustrated, the driving system may be realized in n phases (where $n \geq 3$), if desired. Further, although the horizontal CCD 30 is illustrated as being driven in three phases, it will be readily appreciated that an m phase driving system (where $m \geq 2$) may be adopted so far as the photosignals of two rows can be transmitted.

With the three-phase driving type solid-state imaging device, not only the problems mentioned above can be solved satisfactorily but also many other advantages can be obtained in the practical applications. It is however noted that in order to improve further the photosensitivity which is one of the important factors of the imaging device, a planar structure should be adopted with no corrugation in the oxide film while maintaining the three-layer structure. More specifically, when electrical insulation among the photodiodes or between the photodiodes and the CCD is to be realized by using a thick oxide film 10, the material of the oxide film tends to penetrate to the regions of the vertical CCD and the photodiode during the growth of the oxide film to thereby decrease the areas to be occupied by the CCD and the photodiode. When the area for the CCD is previously selected large in precaution for possible reduction in the area mentioned above, the aperture area (area exposed to the light) will then be decreased correspondingly, to degrade the photosensitivity. The reduction in the aperture area will become very significant when an attempt is made to enhance the resolution power in the future, giving rise to an additional problem.

For preventing aperture ratio from being decreased, there may be adopted the planar structure (having no thick oxide-film regions) in which the CCDs, the pixels (picture elements) and the isolation regions are realized by flat thin oxide films. In that case, however, there will arise a demand for a novel isolation structure which does not rely on the use of oxide film.

SUMMARY OF THE INVENTION

It is therefore a first object of the present invention to provide a CCD type imaging device incorporating a novel and improved isolation structure.

A second object of the present invention is to suppress a dark current possibly produced in the isolation region.

A third object of the present invention is to decrease the area occupied by the overflow transistor in the CCD imaging device to thereby increase the signal charge storage capacity and the sensitivity of the photodiodes.

In view of the first object, there is proposed according to an aspect of the present invention that one or those of the gate electrodes constituting the charge transferring vertical CCDs of the solid-state imaging device which is or are located nearest to the substrate are extended outside of the vertical CCD region to a region where the isolation is required, wherein the isolation layer is imparted with two functions, i.e. the function of the CCD electrode and that of the isolation electrode. With this arrangement, the device as a whole can be realized in a planar structure, whereby a solid-state imaging device enjoying the aperture ratio improved significantly can be provided.

The gate electrode on the isolation region simultaneously serves as the charge transfer electrode of the vertical CCD as well and is applied with potentials of high and low level during the horizontal blanking period with the charge being stored in the vertical CCD only during the horizontal scanning period. On the other hand, it appears that the dark current is produced during the horizontal scanning period of relatively long duration. Accordingly, to accomplish the aforementioned second object of the invention, it is proposed according to another aspect of the invention that the gate electrode on the isolation region is applied with potential of low level during the horizontal scanning period to thereby hold the region underlying the gate electrode in the accumulation state. With this arrangement, electric charge of the polarity opposite to that of the signal charge can be stored below the gate oxide film at least during the horizontal scanning period, whereby generation of the dark current in the isolation region can be effectively suppressed, to another advantage.

With a view to accomplishing the third object of the invention, it is taught according to still another aspect of the invention that the overflow MOS transistor is provided in the isolation region between the photoelectric conversion element and the vertical charge transfer element, wherein the gate of the MOS transistor is made use of in forming a part of a wiring conductor imparted with the isolation function. With this structure, the overflow MOS transistors can be arrayed effectively without lowering the aperture ratio, whereby the blooming can be satisfactorily suppressed.

BRIEF DESCRIPTION OF THE DRAWINGS

FIG. 1 is a view showing a basic structure of a CCD solid-state imaging device known heretofore;

FIG. 2 is a view showing a structure of the CCD solid-state imaging device proposed previously by the inventors;

FIGS. 3A, 3B and 3C are views showing in a plan view and sectional views, respectively, a portion of the vertical CCD shift register in the imaging device shown in FIG. 2 on an enlarged scale;

DESCRIPTION OF THE PREFERRED EMBODIMENTS

Now, the invention will be described in detail in conjunction with exemplary or illustrative embodiments thereof.

Figure 4:
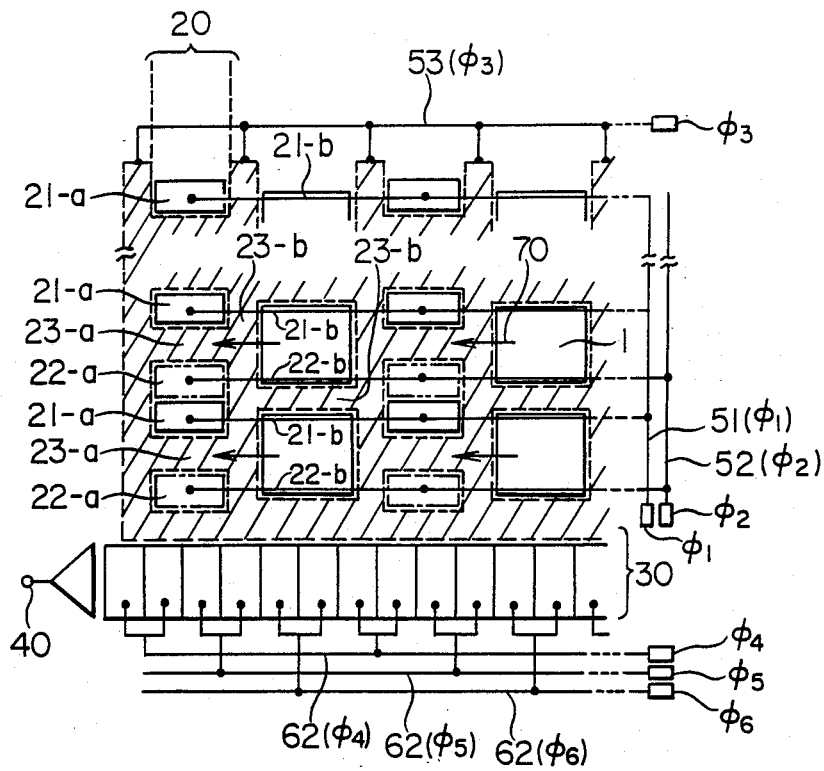
FIG. 4 is a view showing an arrangement of a solid-state imaging device according to an exemplary or illustrative embodiment of the present invention.

FIG. 4 is a view showing a solid-state imaging device according to an embodiment of the invention. In the figure, reference numeral 20 denotes a vertical CCD shift register, 30 denotes a horizontal CCD shift register and 70 denotes transfer gates. The vertical CCD shift register 20 includes gate electrodes 21-a, 22-a and 23-a, wherein the electrodes 21-a and 22-a are interconnected by wiring conductors 21-b and 22-b extending horizontally. The wiring conductors 21-b and 22-b are connected in common to respective common wiring conductors 51 ($\phi_1$) and 52 ($\phi_2$) for supplying clock voltage of first and second phases, respectively. Reference symbol 23-b denotes isolation plate electrodes provided in regions located between adjacent photodiodes or between the photodiodes and the CCDs, the plate electrode 23-b being continuously connected to the gate electrode 23-a. These electrodes 23-a and 23-b are connected in common to a common wiring 53 ($\phi_3$) for applying a clock voltage of third phase, the common wiring 53 being provided horizontally at the top of the device as viewed in FIG. 4.

Figure 5:
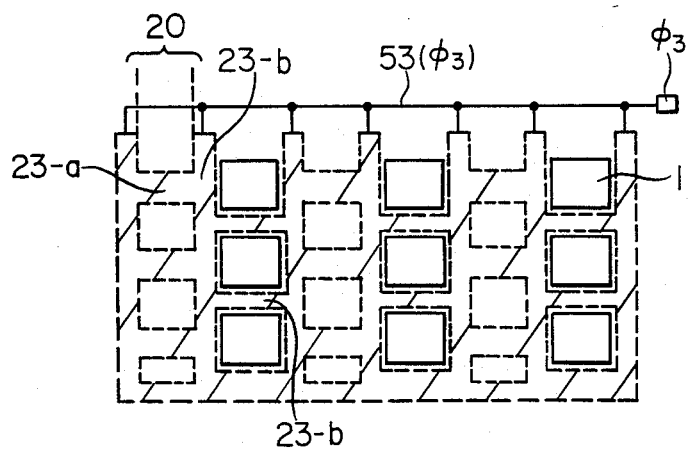
FIG. 5 is a view showing a planar layout of planar electrodes of the device shown in FIG. 4.

FIG. 5 shows by way of example, a planar arrangement of the electrodes (denoted generally by 23) mentioned above, which arrangement is realized according to one of the features of the present invention. For the purpose of simplification, an array of 3×3 pixels is illustrated, only by way of example. In the case of the embodiment under consideration, the gate electrodes 23-a and the plate electrodes 23-b are disposed in a mesh-like pattern and connected to the clock conductor 53 ($\phi_3$) at the top end.

Figure 6A:
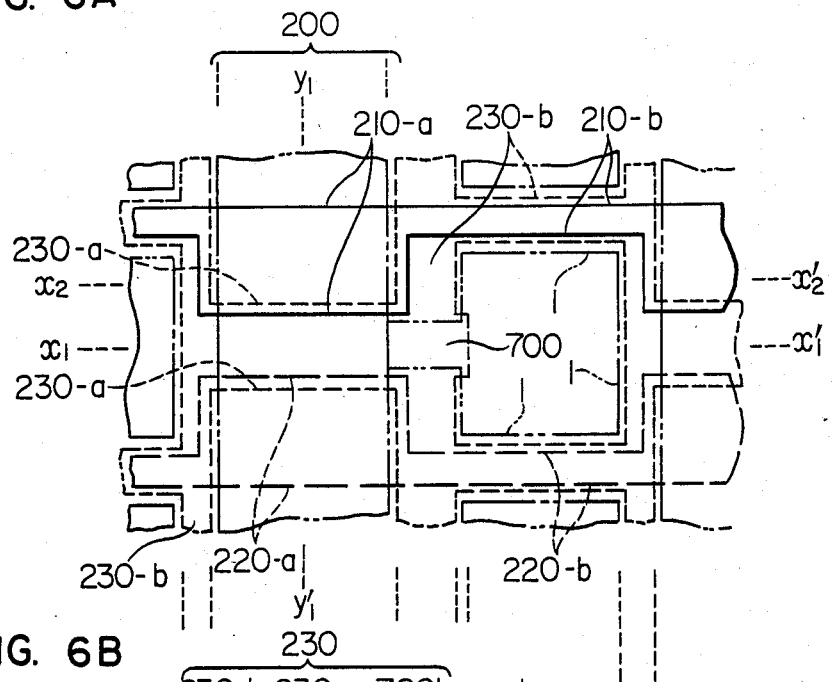
FIGS. 6A, 6B, 6C and 6D show in a plan view and sectional views, respectively, a portion of the device shown in FIG. 4 on an enlarge scale.
Figure 6B:
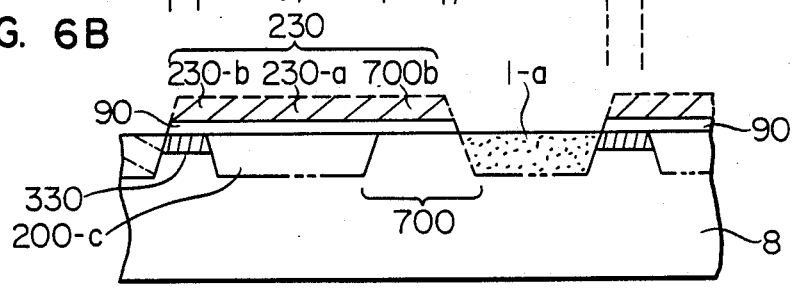
Figure 6C:
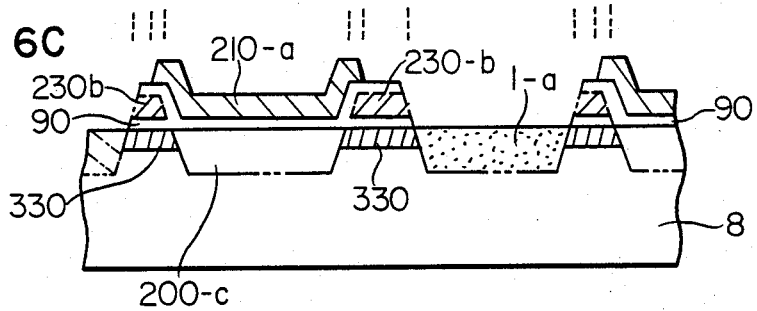
Figure 6D:
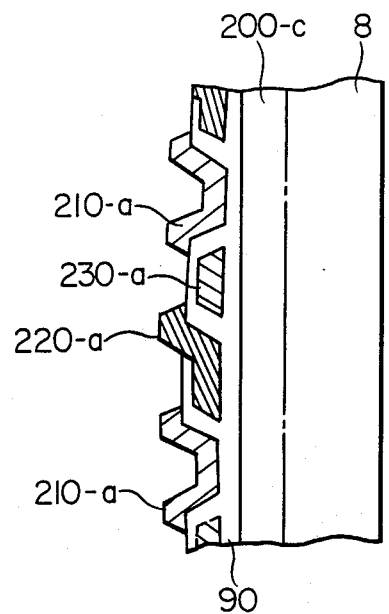

FIG. 6 is a fragmentary plan view showing a planar arrangement of the structural elements, i.e. pixels of the device shown in FIG. 4, FIG. 6B is a sectional view taken along a line $x_1$–$X_1'$ in FIG. 6A, FIG. 6C is a sectional view taken along a line $x_2$–$x_2'$ in FIG. 6A, and FIG. 6D is a sectional view taken along a line $y_1$–$y_1'$ in FIG. 6A. Referring to FIG. 6A, reference numeral 1 denotes a photodiode region, 200 denotes a region for the vertical CCD shift register, 700 denotes a region for the transfer gate, 210-a, 220-a and 230-a denote gate electrode regions, respectively, and 210-b and 220-b denote wiring conductor regions, respectively. Further, 230-a denotes a gate electrode region and 230-b denotes isolation plate electrode region. In the case of the structure shown in FIGS. 6A to 6D, the isolation plate electrode region 230-b is provided between the vertical CCD 200 and the photodiode regions 1 and among the photodiode regions throughout the whole structure. It should however be appreciated that the photodiode regions may be isolated from one another by making use of the electrodes of the wiring regions 210-b and 220-b or alternatively by means of barriers formed by doping the substrate surface of the wiring regions 210-b and 220-b with impurity. In that case, it is not always necessary to provide the isolation plate electrode region 230-b.

It should further be mentioned that the plate electrode region 230-b lying between the photodiodes can be made narrower than the wiring region 210-b.

Referring to FIG. 6B, reference numeral 1-a denotes the photodiode which is composed of a semiconductor layer of a second conductivity type (e.g. n-conductivity type) differing from that of the substrate. Reference symbol 200-c denotes an impurity layer for realizing the vertical CCD 200 in the buried channel type structure, the impurity layer being, for example, on n-type. This layer 200-c may be omitted when the vertical CCD is to be realized in the surface channel type structure. Reference numeral 90 denotes an active gate oxide film, and 230 denotes the lowermost electrode serving also as the gate electrode 230-a, the isolation plate electrode 230-b and the transfer gate electrode 700-b. Although the transfer gate 700-b is constituted by the lowermost electrode layer serving as the electrodes 230-a and 230-b as well in the case of the embodiment under consideration. It will be understood that the transfer gate may be constituted by other discrete electrode. For example, the electrodes 230-a and 230-b may be constituted by a first electrode layer with the transfer gate being constituted by a second electrode layer. Reference numeral 330 denotes an impurity layer provided below the isolating plate electrode 230-b. The impurity layer 330 is of the same type as the substrate (e.g. p-type) and has a higher impurity concentration than the latter for the purpose of increasing the threshold voltage appearing beneath the plate electrode. The impurity layer 330 and the plate electrode 230-b serve to establish electrical isolation among the photodiodes, between the vertical CCDs and the photodiodes, and between the vertical CCDs and horizontal CCDs. With the phrase "electrical isolation", it is intended to mean the state in which neither charge transfer nor current flow takes place. It is to be noted that the impurity layer 330 may be spared when a predetermined threshold voltage can be obtained owing to high impurity concentration of the substrate, for example. In that case, the isolation is accomplished only with the plate electrode.

In FIG. 6C, reference symbol 210-a denotes a gate electrode constituting a part of the vertical CCD 200. Reference numeral 330 denotes the impurity layer which cooperates with the isolating plate electrode 230-b to realize electrical isolation between the photodiodes as well as between the photodiodes and the CCDs.

FIG. 6D shows a vertical section of the vertical CCD 200. In the figure, 230-a denotes the gate electrode formed by a first layer, 210-a denotes the gate electrode formed, for example, by a second layer (or by a third layer) and 220-a denotes the gate electrode formed, for example, by the third layer (or by the second layer). These electrodes may be made, for example, of polycrystal silicon, refractory metal such as Mo, W or the like or alternatively silicide of these metals. The plate electrode 230 is supplied with a pulse-like voltage having three levels of "H" (high), "M" (medium) and "L" (low) from a pulse generator $\phi_3$. The voltage levels "H" and "L" are utilized to drive the gate electrode 230-a, while the voltage level "M" is effective to establish the electrically isolated state in the region located underneath the isolating plate electrode 230-b.

Figure 7:
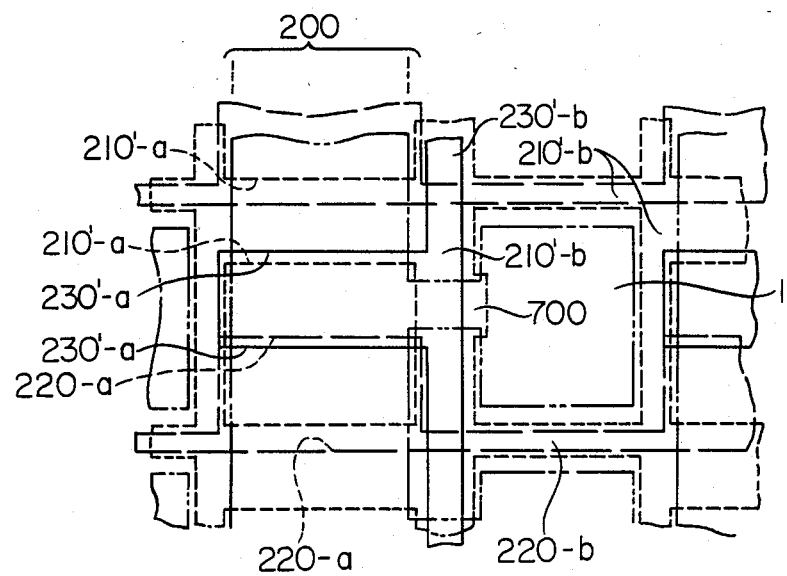
FIGS. 7 and 8 are views showing, respectively, versions of the arrangement shown in FIG. 6.

FIG. 7 shows an electrode array according to another embodiment. In the case of this embodiment, the electrodes constituting the vertical CCD 200 are classified into an upper electrode, an intermediate electrode and a lower electrode, wherein the upper gate electrode 210'-a is constituted by the lowermost electrode layer (first layer), the lower gate electrode 220'-a is constituted by the second electrode layer and the intermediate gate electrode 230'-a is constituted by the third electrode layer. According to this embodiment, the transfer gate 700 is also constituted by the first layer. Reference symbol 210'-b denotes the isolating plate electrode formed by the first electrode layer. Consequently, the wiring conductor 230'-b for the gate electrode 230'-a extends above the wiring conductor of the first layer which constitutes the gate electrode 210'-a.

Figure 8:
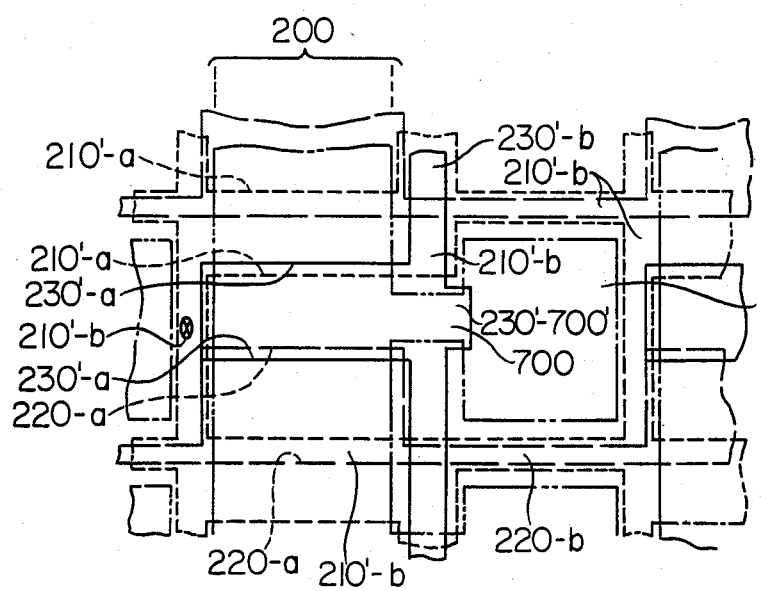

FIG. 8 shows another electrode array which differs from the one shown in FIG. 7 in that the transfer gate is not constituted by the first layer but formed by the same electrode layer as the gate electrode 230'-a. The gate electrodes 210'-a and the isolating plate electrode 210'-b are connected continuously in the region 210'-b instead of the transfer gate region (portion denoted by 700), differing from the structure shown in FIG. 7. More specifically, since the electrode of the first layer is not present at the portion denoted by 700, the electrode 230'-700' formed of the same layer as the gate electrode 230'-a constitutes the transfer gate electrode.

In the case of the embodiments described so far, it is assumed that the common wiring conductor for supplying voltage to the electrodes 210-a and 220-a is disposed on the right hand side. It should however be appreciated that the common wiring conductor mentioned above may be disposed on the left hand side. Similarly, the common wiring conductor 530 for supplying voltage to the electrode 230-a may be disposed on the bottom side instead of the top side as in the case of the illustrated embodiments. For example, this common wiring conductor 530 may be disposed between the vertical CCD and the horizontal CCD in the peripheral region of the photodiode array. Alternatively, the wiring conductor 530 may be disposed beneath the horizontal CCD.

Figure 9:
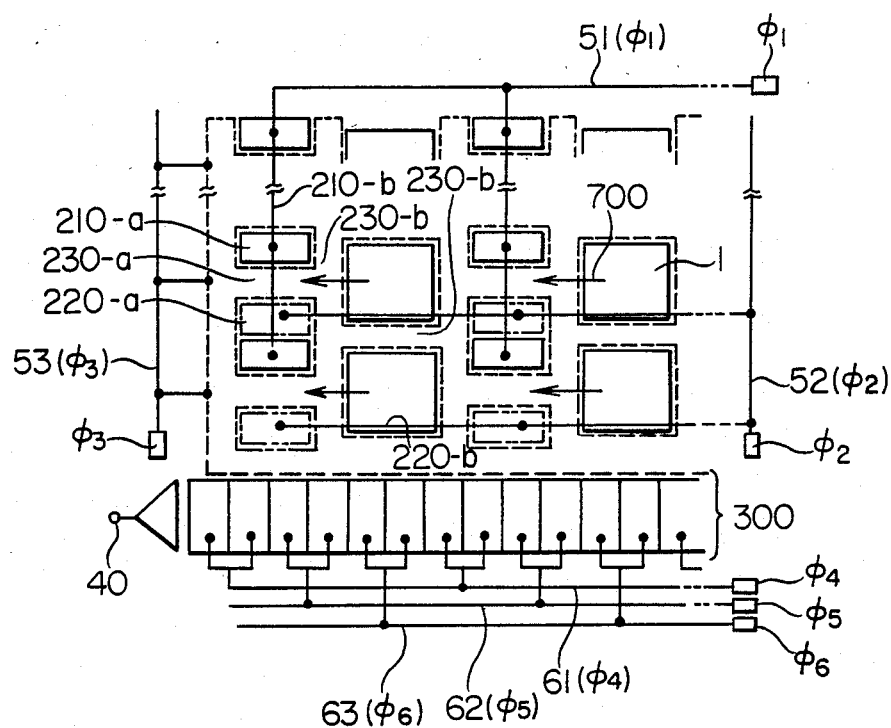
FIGS. 9, 10 and 11 are views showing, respectively, modifications of the imaging device shown in FIG. 4.
Figure 10:
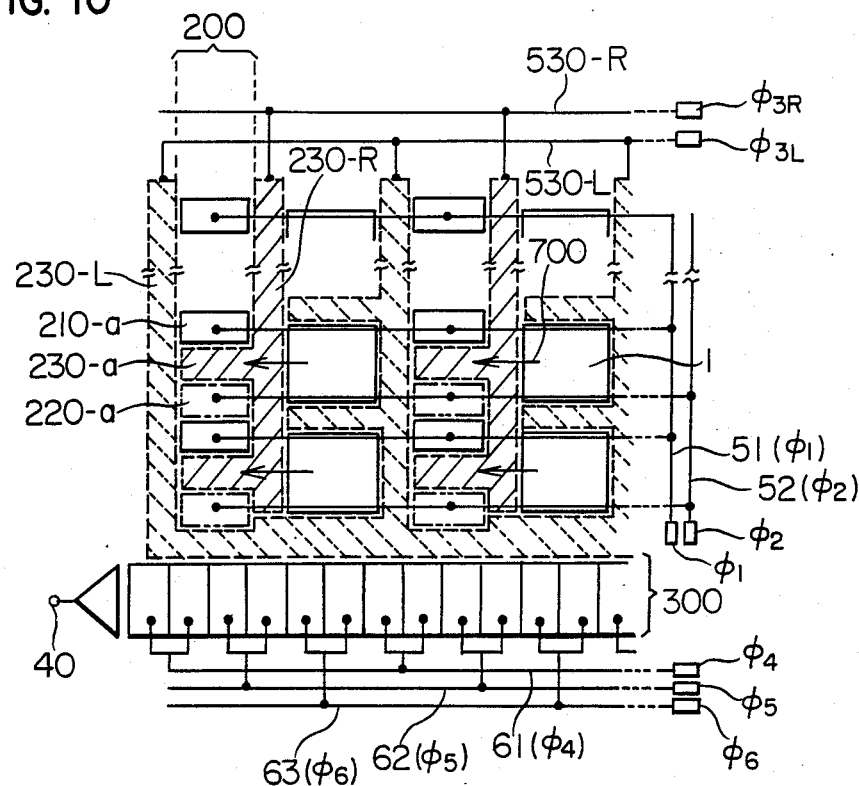

In the case of the embodiment shown in FIG. 4, the wiring conductor 53 ($\phi_3$) for the electrode 23 is disposed on the top side. However, this wiring conductor 53 ($\phi_3$) may be disposed on the left hand side with the wiring conductor 52 ($\phi_2$) disposed on the right hand side, while the wiring conductor 51 ($\phi_1$) may be disposed on the top side, as is in the case of the embodiment shown in FIG. 9. Further, the isolating plate electrode 230 may be separated into discrete electrodes disposed to the right and the left of the vertical CCD 200, respectively, as shown in FIG. 10. In that case, the plate electrode 230-R is connected continuously to the gate electrode 230-a of the vertical CCD and the transfer electrode 700. On the other hand, the isolating plate electrode 230-L serves only for the isolating function these electrodes 230-R and 230-L are connected to common wiring conductors 530-R and 530-L, respectively, at one ends thereof, which conductors are applied with respective predetermined voltages. Since the wiring conductor 230-L can not serve for any other functions than the isolating function, the wiring conductor 230-L may be supplied with the medium level voltage "M" mentioned hereinbefore or alternatively with a reference voltage (e.g. ground potential) for the imaging device. Of course, the plate electrode 230-L may be imparted with other function in addition to the isolation. By way of example, the plate electrode 230-L may be made use of for absorbing excess charge possibly produced upon incidence of light of very high intensity. The excess charge absorption is generally referred to as overflow drain.

In the foregoing, the arrangement and structure of the imaging device according to the invention have been described in conjunction with the illustrative embodiments. It should however be understood that many other various arrangements and structures will readily occur to those skilled in the art. By way of example, the isolating electrode may be realized by using the first layer and the second layer. Accordingly, the number of layers of the electrode constituting the device may be given by n where n is an integer not smaller than "3".

Although the oxide film of the same thickness as the one underlying the gate electrode is used underneath the isolating electrode, it is not always necessary to realize the oxide film in the same film thickness. In other words, the oxide film located underneath the isolating electrode may be slightly thinner or thicker than the oxide film underlying the gate electrode. Further, a combination of thick and thin oxide films may be adopted as in the case of an embodiment shown in FIG. 11.

Figure 11:
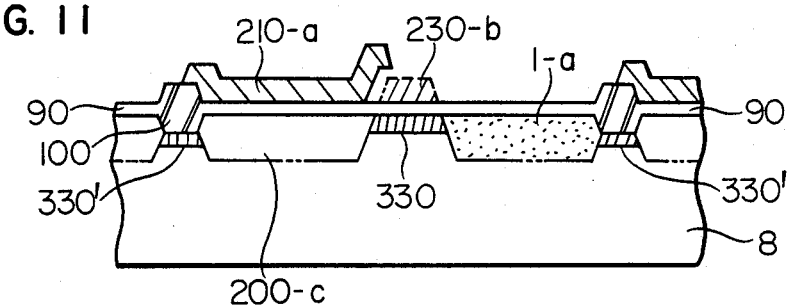

More specifically, FIG. 11 shows a structure corresponding to the one sectioned along the line $x_2$–$x_2'$ in FIG. 6C. In FIG. 11, 100 denotes a thick oxide film, and 330' denotes an impurity layer formed beneath the thick oxide film. (For example, the impurity layer 330' may be formed by doping with p-type impurity at a higher concentration than the substrate.) As described hereinbefore, the impurity layer 330' serves for increasing the threshold voltage to thereby improve the isolation. Accordingly, if no problem arises in conjunction with the isolation, this impurity layer may be spared. In the case of the structure shown in FIG. 11, the aperture ratio is more or less lowered when compared with that of the structure shown in FIG. 4 in which the thin oxide film is used throughout the device. However, when compared with the conventional device in which the isolation is realized with the thick oxide film, the aperture ratio of the structure shown in FIG. 11 can be increased by several ten percentages, assuring thus sufficient utility in practical applications.

Figure 12:
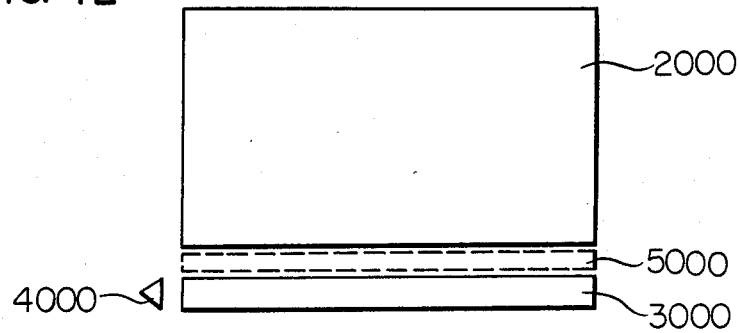
FIG. 12 is a view showing a solid-state imaging device according to another embodiment of the invention.

The isolation structure according to the present invention can exhibit most significant effects in the pixel region (region covering the vertical CCD, the photodiodes and others) which is subjected to restriction in size in the vertical and horizontal directions (i.e. in the two-dimensional size). In this connection, it is noted that the horizontal CCD is not subjected to any dimensional restriction in the vertical direction, whereby the horizontal CCD can occupy a sufficiently large area, although the horizontal CCD also undergoes dimensional restriction in the vertical direction. Further, the signal detection circuit 4-1 can be allocated with a sufficiently large area in both vertical and horizontal directions, because the signal detection circuits 41 are not disposed in an array but located discretely in the number of one to three. By taking advantage of the geometrical features mentioned above, the isolation of the pixel region 2000 can be realized through cooperation of a thin oxide film and the isolating plate electrode in the manner shown in FIG. 4 while the isolation of the horizontal CCD region 3000, the signal detection circuit region 4000 and a region 5000 located between the horizontal CCD and the vertical CCD may be accomplished with a thick oxide film as in the case of the conventional device, as is illustrated in FIG. 12. Further, the isolation for these regions may be realized with a combination of a thick oxide film and the isolating plate electrode or alternatively with a combination of slightly thinner oxide film than that employed in the conventional device and the isolation plate electrode.

In the case of the embodiments described so far, it is assumed that the horizontal CCD shift register is realized in a single row. However, there may arise such situation in which l rows of the horizontal shift registers (where l is an integer greater than 2) are required for handling a large amount of information to be transferred or for dealing with an expectable higher scanning speed. In that case, the isolating plate electrodes may be disposed between plural rows of the horizontal CCDs for realizing isolation among them or alternatively the horizontal CCDs may be isolated form each other by using a thick oxide film as in the case of the conventional imaging device in view of the fact that a relatively large area is available for the horizontal CCD.

As will be appreciated from the foregoing description, according to the present invention which teaches that one of the three conductive layers (first, second and third layers) constituting the CCD shift register is imparted with the important function of electrical isolation (e.g. isolation between the pixels, isolation between the pixels and the vertical CCD shift register, isolation between the vertical and the horizontal CCD registers etc.), there can be obtained advantageous effects mentioned below.

Since the size (area) required for the electrical isolation can be reduced significantly, (1) the aperture can be enlarged significantly, (2) the pixel size can be reduced, and (3) the quantity of charge carried by the CCD registers can be increased. These effects in turn contribute to improvement of the photosensitivity, resolution power, dynamic range and others, to great advantage for the practical applications.

In the case of the embodiments described above, the gate electrode of the vertical CCD is imparted with the function of the isolation electrode. Accordingly, when a gate voltage is applied, a depletion layer will be generated in the substrate surface underlying the gate oxide film in the isolation region, which gives rise to a problem that noise charge is produced in the interface of the gate oxide film due to a dark current. Besides due to unevenness of the dark current, white spots, noise of a fixed patterns and other unwanted phenomena may take place. With a view to solving these problems, the present invention also teaches that the gate electrode disposed on the isolation region is held at potential of a low level at least during the horizontal scanning period to thereby maintain the substrate surface within the isolation region in the accumulation state. More specifically, the plate electrodes 23-a and 23-b shown in FIG. 4, the plate electrodes 230-a and 230-b shown in FIG. 6, the plate electrodes 210'-a and 210'-b shown in FIG. 7 and the plate electrodes 210'-a 210'-b shown in FIG. 8 are set at low potential.

Figure 13:
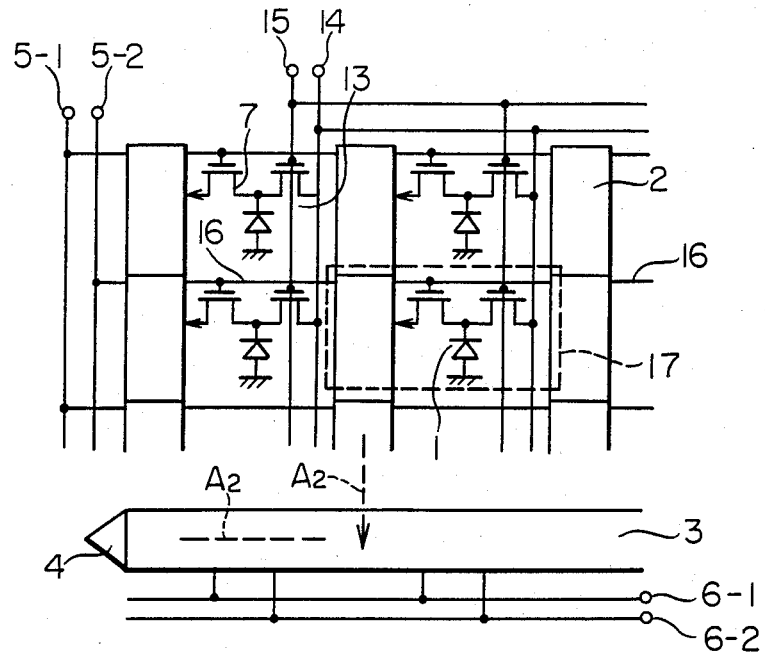
FIG. 13 is a view for illustrating the structure of a conventional CCD-solid-state imaging device incorporating overflow MOS transistors.

FIG. 13 is a view showing schematically a structure of the CCD type solid-state imaging device incorporating overflow MOS transistors. In FIG. 13, reference numeral 1 denotes photoelectric conversion elements each constituted, for example, by a photodiode, and 2 and 3 denote a vertical CCD shift register and a horizontal shift register for extracting photo-signals stored in the photoelectric conversion elements to an output terminal 4. Reference numerals 5-1, 5-2, 6-1 and 6-2 denote input terminals to which clock pulse for driving the vertical shift register 2 and the horizontal shift register 3 are applied. Although it is assumed that two-phase clock pulse signal is employed in the case of the embodiment shown in FIG. 13, it will be readily understood that four-phase or three-phase clock pulse signal may be used. Reference numeral 7 denotes a charge transfer MOS transistor for transferring charge stored in the photodiode 1 to the vertical shift register 2. Although the gate of this charge transfer MOS transistor is shown as serving for the electrode 2-1 of the vertical CCD shift register, it will be appreciated that the imaging device can be realized in such a structure in which the independent electrodes can be employed for the gates (i.e. the structure in which the CCD electrode and the transfer gate electrode are separated to operate independently). Reference numeral 13 denotes an overflow MOS transistor for causing the excess charges produced upon illumination with light of very high intensity to flow into the drain 4, numeral 15 denotes an overflow control gate for controlling the drainage potential of the overflow MOS transistor. Reference numeral 16 designates a wiring region for the vertical CCD electrode and $A_2$ denotes the direction in which the charge is transferred. The device of the structure as it is shown operates as a black and white imaging device. By providing color information by stacking color filters as mentioned hereinbefore, the device can operate as a color imaging device.

Figure 14:
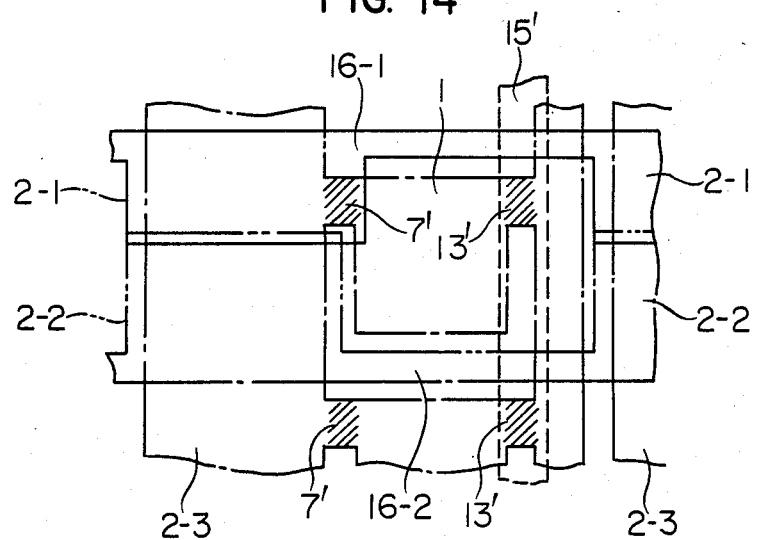
FIG. 14 is a plan view showing a portion of the imaging device of FIG. 13 on an enlarged view.

The solid-state imaging device can enjoy various advantages such as small size, light weight, maintenance-freedom and low power consumption when compared with electronic imaging tubes due to implementation in the solid-state structure, promising thus a great usefulness. However, the CCD type imaging device available at present suffers a problem that photosensitivity is low for the reasons mentioned below. FIG. 14 is a view showing a planar arrangement of a pixel (shown as enclosed by a broken-line block) constituting the indispensable structural element of the imaging device shown in FIG. 13. In FIG. 14, reference numeral 2-1 denotes an electrode constituting a vertical CCD which electrode also serves for the gate of the transfer MOS transistor (and which may be formed of the first layer of polycrystal silicon), 2-2 denotes another electrode of the vertical CCD 2 (which electrode may be constituted by the second layer of policrystal silicon), 2-3 denotes a channel region of the vertical CCD 2 (where the term "channel" means a passage for the electric charge), and 7' denotes a gate region of the transfer MOS transistor 7. Further, reference numeral 13' denotes a gate region of the overflow MOS transistor 13, and numeral 15' denotes a wiring conductor for the control gate 15. When the incident light is of very high intensity, an excess electric charge is produced electric charge which can not be stored in the photodiode 1, and this excess charge is drained through the gate region 13'. Due to such drainage of the excess charge, the blooming can be prevented from occurrence, whereby the image quality can be significantly improved. With the term "blooming", it is intended to mean such phenomenon that the charge in excess flows out to the adjacent vertical CCD 2 to thereby produce white stripe on the monitor screen in the longitudinal direction thereof.

However, the gate electrode region 13', and the control gate wiring conductor 15' occupy a large proportion of the area allocated for the pixel, as a result of which the area for the photodiode as well as the area illuminated by light (usually referred to as the aperture ratio) is significantly reduced. The reduction in the area of the photodiode involves lowering in the storage capacity for the signal charge, being accompanied with another problem that the dynamic range is undesirably narrowed. The area available for the photodiode is further decreased due to the necessity of area for isolating the regions 13' and 15'. On the other hand, the aperture ratio amounts at highest to about 20% due to the presence of the regions 13' and 15' (which means that only 1/5 of the quantity of incident light can be utilized for producing signals), whereby the photosensitivity is lowered, presenting a great problem in the CCD type imaging device. Besides, when the pixel size is to be decreased in an attempt to realize a higher resolution power, the proportion of the areas occupied by the regions 13' and 15' is increased correspondingly, resulting in that the dynamic range as well as the photosensitivity will be further reduced. Also in the MOS type imaging device which is comparable to the CCD type imaging device as the solid-state imager, an overflow MOS transistor is additionally provided in association with the photodiode for the purposes of suppressing the unwanted blooming phenomenon. In the case of the MOS device, the signal transfer is conducted through metallic conductor in contrast to the signal transfer in the CCD imaging device. Accordingly, a relatively large area remains available because of the absence of the CCD shift register or other elements which occupy a large area. Further, even when the overflow drain is provided as described above, reduction in the area for the photodiode as well as the aperture ratio is small when compared with the CCD imaging device. Accordingly, it is a very important problem for the CCD imaging element to improve the structure of the overflow MOS transistor and decrease as much as possible to areas occupied by the transistor and the wiring conductors.

Figure 15:
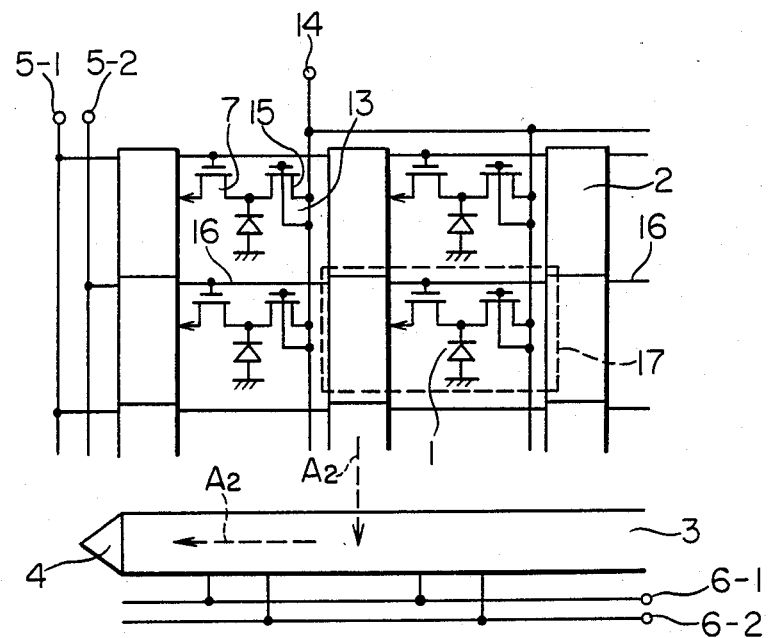
FIG. 15 is a view showing a solid-state imaging device according to still another embodiment of the present invention.
Figure 16:
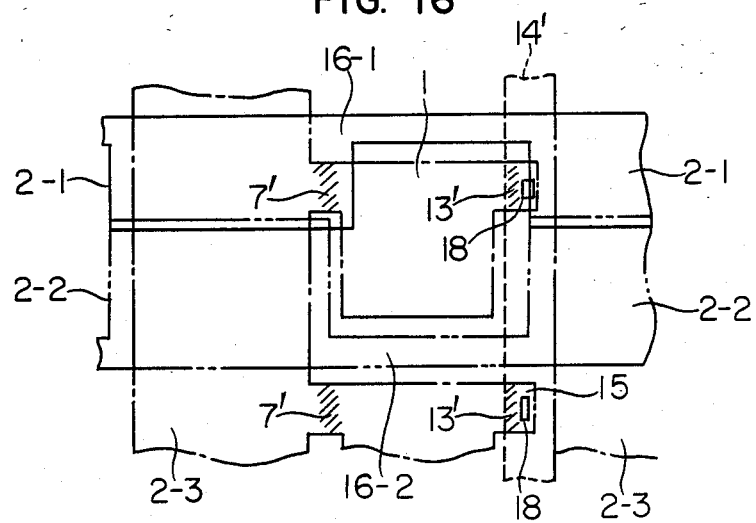
FIG. 16 is a plan view showing on an enlarged scale a portion of the imaging device shown in FIG. 15.

In the following, description will be made on further embodiments of the present invention which is directed to the solution of the abovementioned problems. FIG. 15 shows an imaging device embodied in the light of the situation explained above. In FIG. 15, same elements as those shown in FIG. 13 are denoted by like reference symbols. The device shown in FIG. 15 differs from the one shown in FIG. 13 in the respect that the overflow control gate for controlling the drainage potential of the overflow MOS transistor 13 is connected to the wiring conductor 14 provided for the drain electrode. FIG. 16 shows a planar arrangement of a pixel, a structural unit of the imaging device shown in FIG. 15 (a portion shown as enclosed by a broken line block). In FIG. 16, reference numeral 2-1 denotes an electrode constituting a part of the vertical CCD serving also as the transferring MOS transistor 7 (which electrode may be formed by the second layer of polycrystal silicon), 2-2 denotes another electrode may be formed by a third layer of polycrystal silicon, 2-3 denotes a channel region of the vertical CCD 2 (where "channel" means a passage for the electric charge), and 7' denotes a gate region of the transfer MOS transistor 7. Further, reference numeral 13' denotes a gate region of the overflow MOS transistor 13, numeral 15' denotes a drain region of the overflow MOS transistor 13, numeral 14' denotes a wiring conductor for a common drain 15 (which conductor may be formed by the first layer of polycrystal silicon), 18 denotes a through-hole for interconnecting the drain 15' and the wiring conductor 14'. When the incident light is of extremely high intensity, there will be produced electric charge in excess to be incapable of being stored in the photodiode 1. The excess charge is then drained to the wiring conductor 14' for the drain through the gate region 13', whereby the unwanted blooming phenomenon can be prevented from occurrence. As will be seen in the layout diagram shown in FIG. 16, the aperture ratio can be prevented from being decreased while suppressing the blooming even when the overflow MOS transistor is additionally provided by virtue of such arrangement that the wiring conductor 14' is provided in the isolation region between the photoelectric conversion element and the vertical CCD shift register so that a portion of the wiring conductor 14' also serves as the gate electrode and the drain of the overflow MOS transistor 13.

Figure 17:
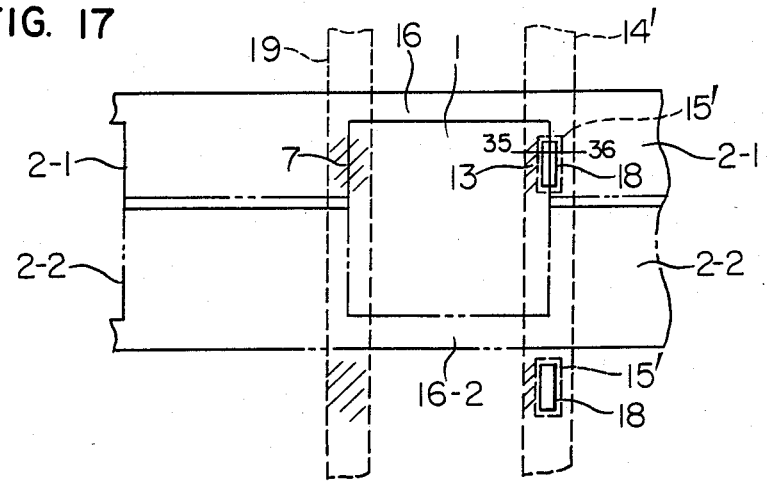
FIGS. 17, 18, 19, 20 and 21 show, respectively, versions of the structure shown in FIG. 16.

FIG. 17 shows an improved modification for the embodiment shown in FIG. 15. In FIG. 17, like parts as those shown in FIG. 16 are denoted by same reference symbols. The isolation of the individual photoelectric conversion elements in the vertical direction is realized by setting the electrode wiring conductor 16-1 or 16-2 of the vertical CCD shift register at a predetermined potential level. On the other hand, isolation between the photoelectric conversion elements 1 and the adjacent vertical shift register located to the right of the elements 1 is realized by the wiring conductor 14' which also serves as the drain and the gate of the overflow MOS transistor. Further, isolation between the photoelectric conversion elements 1 and the vertical shift register located to the left of the element 1 and serving for the signal transfer is realized by the wiring conductor 19 serving also as the transfer gate 7. As will be seen, the thick oxide film otherwise required is rendered unnecessary, whereby the area of the isolation region can be effectively enlarged, which in turn means that the aperture area can be increased when compared with the embodiments shown in FIGS. 15 and 16. Besides, since the transfer gate 17 can be controlled independent of the clock for controlling the charge transfer elements, the driving scheme can be simplified.

Figure 18:
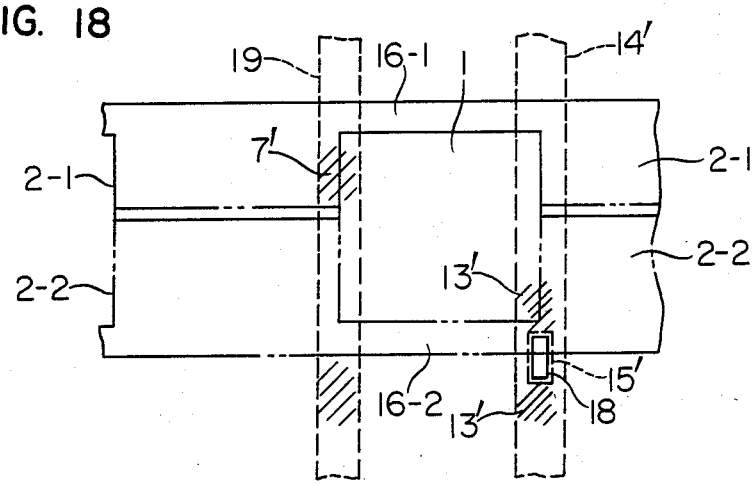
Figure 19:
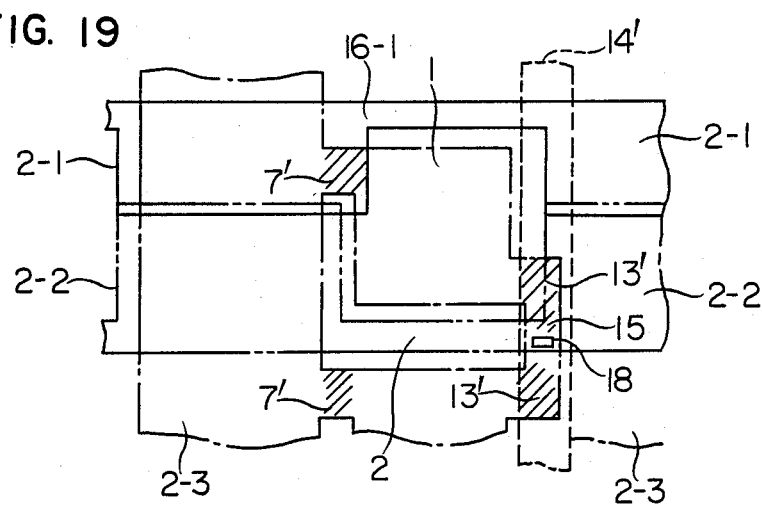
Figure 20:
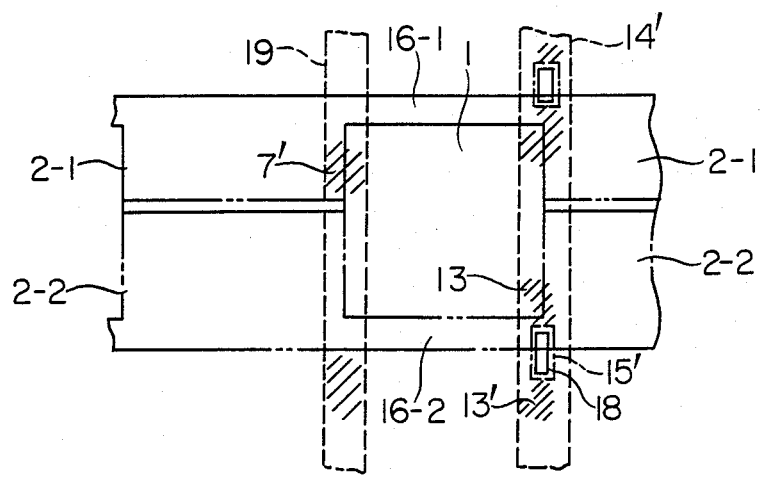
Figure 21:
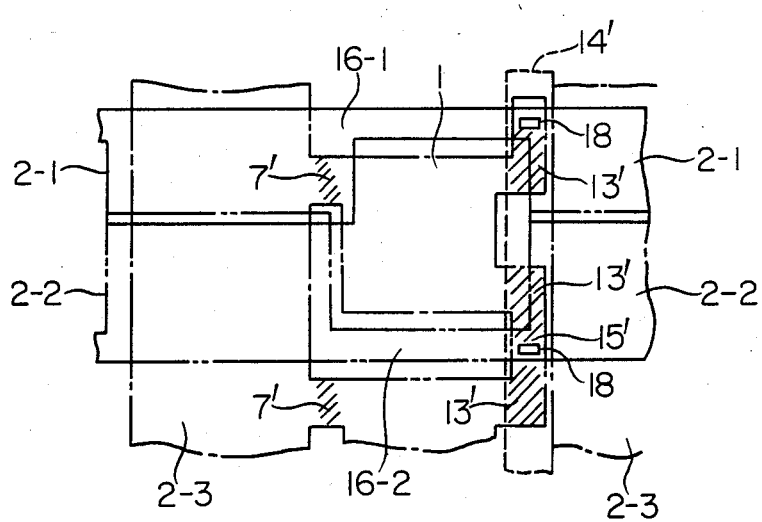

FIG. 18 shows a modification of the embodiment shown in FIG. 17, while FIG. 19 shows a version of the embodiment shown in FIG. 16. In the case of these modifications, the drain of the overflow MOS transistor is adapted to be used in common by two photoelectric conversion elements positioned adjacent to each other in the vertical direction. With this arrangement, the number of the through-holes 18 can be reduced to a half, which is preferred from the standpoint of the yield in the manufacture of the device. The embodiments shown in FIGS. 20 and 21 correspond to those shown in FIGS. 18 and 19, respectively, except that one overflow MOS transistor is provided in association with each of the photoelectric conversion elements in the case of the embodiment shown in FIG. 20, while two overflow MOS transistors are provided for each photoelectric conversion element on the upper and lower sides thereof, respectively, in the case of the embodiment shown in FIG. 21. With these arrangements, dispersion in performance of the overflow MOS transistor due to manufacturing tolerance can be effectively obviated, while the drainage capability of excess charge can be enhanced.

In the foregoing description, it has been assumed that the vertical shift register has two gate electrodes for each of the photoelectric conversion elements. However, the principle of the present invention can be equally applied to such arrangement in which the vertical shift register provided with two or four gates is provided for each photoelectric conversion element so that the shift register can carry two flows of electric charge.

It should be added that the photodiode 1 may be of n-type layer of such a low impurity concentration that complete depletion occurs upon reading out of the signal or alternatively made of a n+-layer of high concentration which cannot undergo complete depletion.

Further, the photodiode may be constituted by MIS (Metal Insulator Semiconductor) diode instead of the junction type diode described above.

The device may be realized in a p-type silicon substrate or alternatively within a p-type well formed in an n-type silicon substrate.

Figure 22:
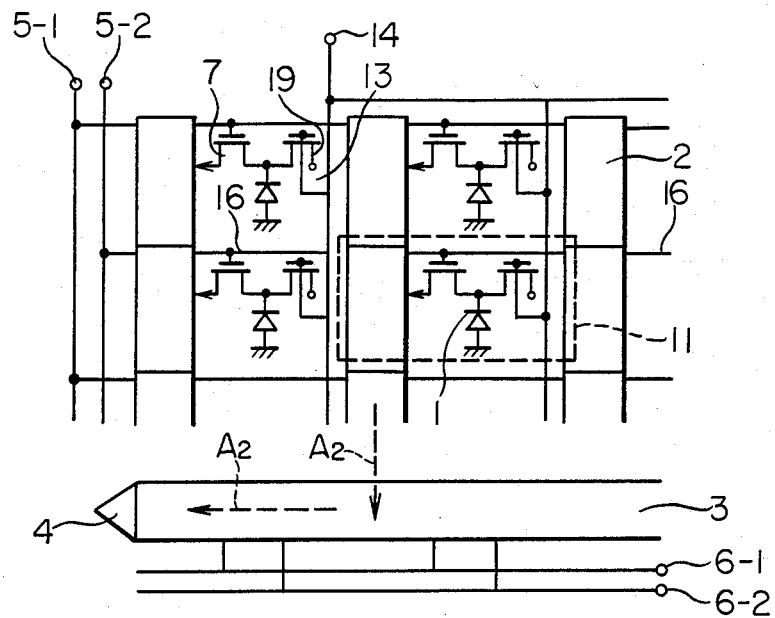
FIG. 22 is a view showing a modification of the imaging device shown in FIG. 15.
Figure 23:
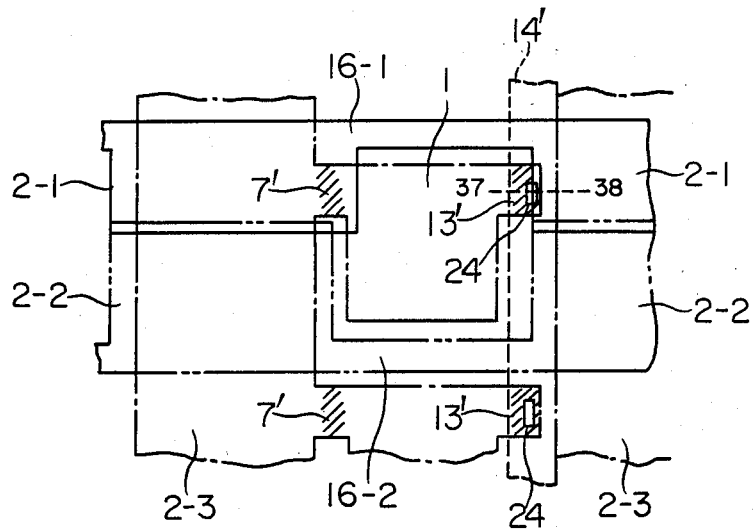
FIG. 23 shows on an enlarged scale a portion of the imaging device shown in FIG. 22.
Figure 24:
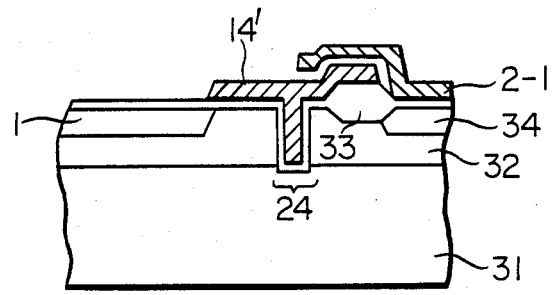
FIG. 24 is a fragmentary sectional view of the structure shown in FIG. 23.

FIGS. 22 and 23 show embodiments realized within a p-type well formed in an n-type silicon substrate. In the case of the embodiment shown in FIG. 22, the drain 19 of the overflow MOS transistor is not connected to the wiring conductor 14 but to the substrate. FIG. 23 is a plan view of the device shown in FIG. 22 and FIG. 24 is a sectional view taken along the line 37–38 in FIG. 23. In the figures, 31 denotes the substrate of n-conductivity type, for example, and 32 denotes p-type well layer. The through-holes 24 of the well layer 32 are removed and the side surfaces of the through-holes are made use of as the gate region. The bottom of the through-hole is in contact with the n-type substrate 31. Accordingly, excess charge overflowing from the photodiode 1 can be discharged to the n-type substrate serving as the draining electrode through the p-type well layer surface underlying the wiring conductor and the side surface of the through-hole serving as the gate channel region. Reference numeral 33 denotes a thick oxide film for the isolation purpose, and 34 denotes an n-type diffusion layer constituting the channel for the vertical charge transferring element.

Figure 25:
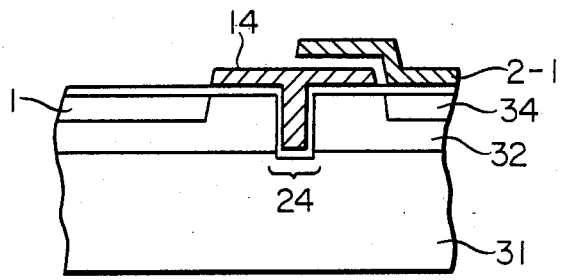
FIG. 25 is a fragmentary sectional view of the structure shown in FIG. 17.

FIG. 25 shows an embodiment which corresponds to the structure shown in FIG. 24 and applied to the arrangement shown in FIG. 17. More specifically, FIG. 25 is a sectional view corresponding to the one taken along a line 35–36 in FIG. 17. No thick oxide film for isolation is provided. The wiring conductor 14' serves for the isolating function.

The arrangement shown in FIG. 22 can be obviously applied to the embodiments shown in FIGS. 18 to 21.

We claim:

1. A solid-state imaging device comprising:
   a semiconductor body;
   a plurality of photoelectric conversion elements formed on said semiconductor body and arranged in horizontal and vertical directions;
   a plurality of vertical charge transfer devices which vertically transfer charge and which are composed of a plurality of sets of at least first and second electrodes;
   a plurality of transfer gates through which signal charge produced in each said photoelectric conversion elements in response to incident light is transferred to a channel beneath a predetermined electrode of said vertical charge transfer devices;
   a horizontal charge transfer device by which the signal charges delivered from said vertical charge transfer devices are horizontally transferred; and
   an overflow transistor provided in an isolation region lying between one of said photoelectric conversion elements and one of said vertical charge transfer devices for discharging externally excess charge produced upon incidence of light having high intensity, said overflow transistor having a gate thereof comprised of a portion of a third electrode disposed in said isolation region, and wherein a drain of the overflow transistor and the gate of the overflow transistor are electrically coupled to each other so as to reduce a required area of the overflow transistor.

2. A solid-state imaging device according to claim 1, wherein said third electrode is electrically connected to the drain of the overflow transistor so as to act as a drain electrode.

3. A solid-state imaging device according to claim 1, wherein an isolation region between the photoelectric conversion elements and the adjacent vertical charge transfer device located to the right of the photoelectric conversion elements is realized by the third electrode which also serves as the drain and the gate of the overflow transistor.

4. A solid-state imaging device according to claim 1, wherein the drain of the overflow transistor is adapted to be used in common by two photoelectric conversion elements positioned adjacent to each other in the vertical direction.

5. A solid-state imaging device according to claim 1, wherein two overflow transistors are provided for each photoelectric conversion element on upper and lower sides thereof respectively.

6. A solid-state imaging device according to claim 1, wherein said semiconductor body comprises a p-type silicon substrate.

7. A solid-state imaging device according to claim 1, wherein said semiconductor body comprises a p-type well formed in an n-type silicon substrate.

8. A solid-state imaging device according to claim 1, wherein said semiconductor body comprises an n-type silicon substrate and a p-type well formed in the n-type silicon substrate, and wherein the n-type silicon substrate acts as a drain electrode.

9. A solid-state imaging device according to claim 1, wherein said vertical charge transfer devices, said transfer gates, said horizontal charge transfer device, and said overflow transistor are formed on said semiconductor body.

* * * * *